United States Patent [19]

Becker

[11] 4,423,382

[45] Dec. 27, 1983

[54] CIRCUIT FOR GENERATING TWO PERIODIC SIGNALS HAVING A CONTROLLABLE PHASE RELATIONSHIP THEREBETWEEN

[75] Inventor: Dustin J. Becker, Lorain, Ohio

[73] Assignee: Reliance Electric Company, Cleveland, Ohio

[21] Appl. No.: 291,454

[22] Filed: Aug. 10, 1981

[51] Int. Cl.³ .............................................. H03K 5/153

[52] U.S. Cl. ...................................... 328/55; 328/155; 307/262

[58] Field of Search ........................... 328/55, 57, 155; 307/262, 511

[56] References Cited

U.S. PATENT DOCUMENTS

| | | | |
|---|---|---|---|
| 3,382,379 | 5/1968 | Lawless | 307/262 |
| 3,601,708 | 8/1971 | Stempler et al. | 328/155 |
| 4,137,503 | 1/1979 | Ziesmer | 328/55 |

*Primary Examiner*—John S. Heyman
*Attorney, Agent, or Firm*—Michael M. Rickin

[57] ABSTRACT

A circuit for generating at least two periodic output signals having a phase relationship controllable between zero and 180 degrees as a function of a d.c. control signal as compared to a ramp signal. Also included is circuitry for controlling the phase relationship to be at substantially 180 degrees when the d.c. control signal is always greater than the ramp signal and to be at substantially zero degrees when the d.c. control signal is always less than the ramp signal.

10 Claims, 5 Drawing Figures

CIRCUIT FOR GENERATING TWO PERIODIC SIGNALS HAVING A CONTROLLABLE PHASE RELATIONSHIP THEREBETWEEN

CROSS REFERENCE TO RELATED APPLICATIONS

Of interest is the following copending application Ser. No. 291,455 also entitled "Circuit for Generating Two Periodic Signals Having a Controllable Phase Relationship Therebetween" which is filed on even date herewith, is based on the invention of Gary G. Siegmund et al and is assigned to the same assignee as the present application.

BACKGROUND OF THE INVENTION

1. Field of the Invention

The present invention relates to a circuit for generating two periodic signals having a controlled phase relationship and more particularly to circuitry which generates the two periodic signals with a phase relationship of from zero to 180 degrees, which phase is dependent on the amplitude of a d.c. control signal.

2. Description of the Prior Art

In many control systems an output parameter such as voltage, current or power is controlled by controlling the displacement angle between a primary waveform and a phase shifted version of the primary wave. The displacement angle may fluctuate anywhere from zero degrees to 180 degrees. Two well known prior art techniques for controlling this displacement angle are either the use of a phase-locked loop or the use of a delay timer system. The phase-locked loop system locks two oscillators into frequency synchronization and controls the phase angle between them by manipulating the phase detector parameters. The phase-locked loop system is, however, subject to problems. These problems arise as a result of instabilities in the control loop and difficulties in the operation of the capture and track modes of the phase locked-loop. When used as part of a larger control system these problems may make the larger system extremely difficult to stabilize.

The delay timer system has a main oscillator for generating the primary waveform. The secondary or phase shifted version of the primary waveform is generated by setting a delay. The delay is set as a predetermined time from the zero angle point. The principal problem with the delay timer system is that it is quite difficult to reduce the phase angle below a predetermined set point. This difficulty arises because of minimum output pulse restrictions imposed on most commercially available timing circuits.

The circuit of the present invention allows the phase angle between the main output and the phase shifted version thereof to vary between zero degrees and 180 degrees without any of the problems associated with the previously described phase-locked loop and delay timer systems.

SUMMARY OF THE INVENTION

According to the present invention there is provided a circuit which generates as a function of a d.c. control signal at least two periodic output signals having a phase relationship controllable between zero and 180 degrees. The circuit includes an oscillator for generating a periodic signal, which is not either of the periodic output signals, the oscillator generated signal having a first portion of one amplitude and a second portion of a second amplitude. Means are included to generate in response to the oscillator signal a signal having a ramp waveform with the ramp starting each time the oscillator signal first portion begins. A comparator compares the ramp signal to a d.c. control signal and generates a signal having a first amplitude when the control signal exceeds the ramp and a second amplitude when the ramp exceeds the control signal. In response to the oscillator signal, a first output means generates one of the output signals and another identical signal having a 180 degree phase relationship thereto. A second output means generates the other of the output signals in response to the signals generated by the first means and the comparator means when the comparator signal changes in amplitude from the first to second amplitude.

DESCRIPTION OF THE DRAWING

Referring to FIG. 1 there is shown a block schematic diagram of a circuit 10 for generating in response to a d.c. error signal at least two square waves having a controllable phase relationship therebetween. The phase relationship between the square waves is controlled as a function of the magnitude of the error signal. The operation of circuit 10 will first be described with reference to the schematic diagram of FIG. 1 and the waveforms shown in FIG. 2.

Figure 1:
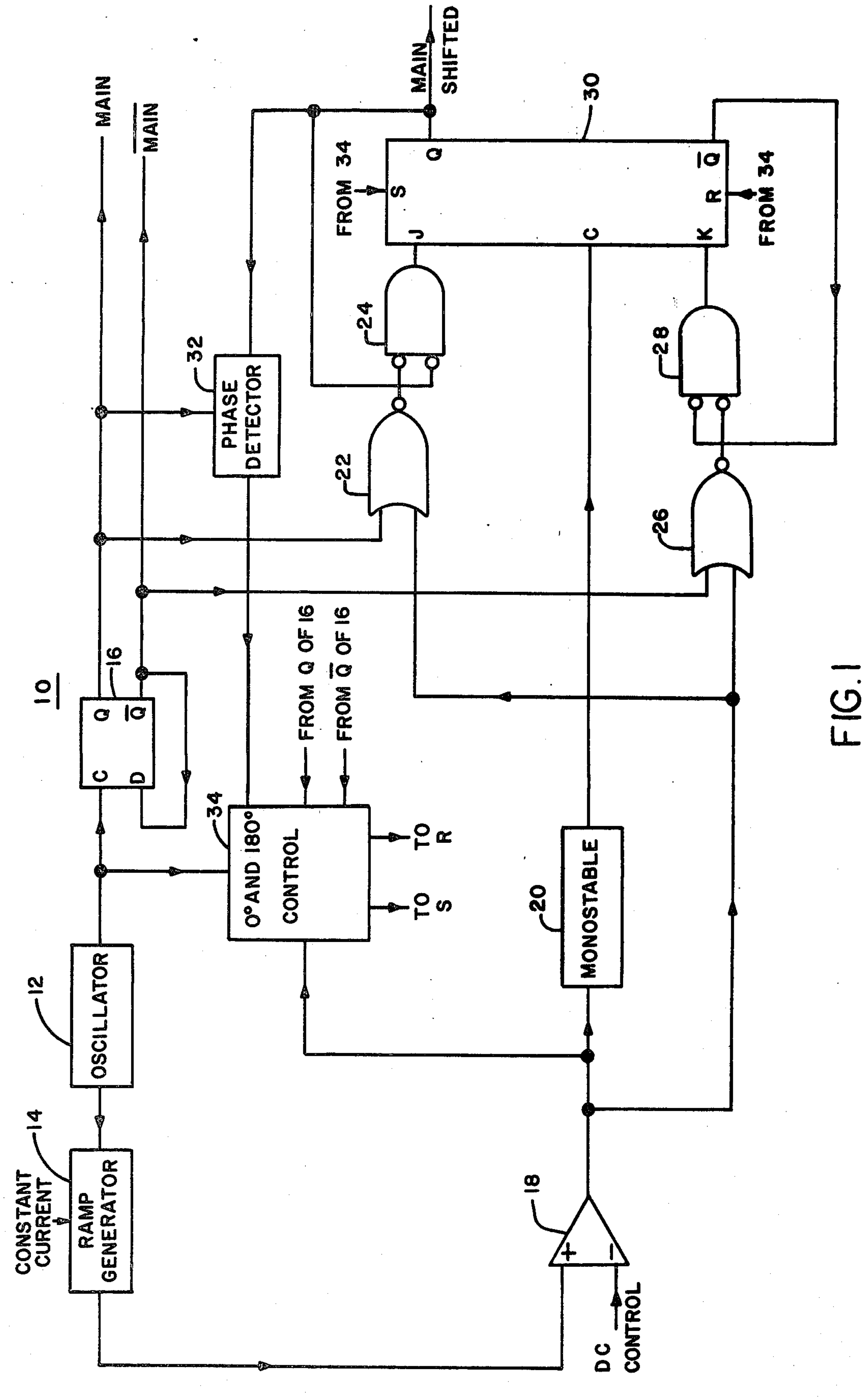
FIG. 1 is a block-schematic diagram illustrating one embodiment of the present invention.

An oscillator 12 is arranged to generate the rectangular waveform shown in FIG. 2*a*. A D type flip-flop 16 receives at its clock (C) input the waveform generated by oscillator 12. The $\overline{Q}$ output of the flip-flop is connected to its D input. This connection insures that each time the clock signal undergoes a positive transition the flip-flop changes its state. Therefore, there appears at the Q and $\overline{Q}$ outputs of flip-flop 16 signals identified in FIG. 1 as MAIN and $\overline{\text{MAIN}}$. These signals are square waves which are 180 degrees out of phase with respect to each other and at half of the frequency of the oscillator output signal. The MAIN signal is shown in FIG. 2*b*.

The signal generated by oscillator 12 is also connected to ramp generator 14. Generator 14 functions to generate a ramp signal of positive slope with a period equal to the period of the square wave generated by oscillator 12. This ramp signal is shown in FIG. 2*c*. To generate this signal circuit 14 may be comprised of a suitably arranged transistor-capacitor combination wherein the capacitor receives, when the transistor is not conducting, a constant current from a source (not shown). Charging of the capacitor for a time substantially less than one time constant results in the ramp signal being generated across the capacitor. Upon the generation by oscillator 12 of the negative-going pulse shown in FIG. 2*a,* the transistor is turned on and the capacitor discharges.

The ramp waveform generated by circuit 14 is applied to the noninverting input of operational amplifier 18. A d.c. control signal, shown also in FIG. 2*c,* is applied to the amplifier's inverting input. Circuit 10 is typically used in the feedback loop of a system to maintain control over one or more of the system's output parameters. The output signals generated by circuit 10 are then used to control those system elements which regulate the system parameter(s) under control. The control signal represents the difference between the actual value of the system parameter under control and the desired value of that parameter. The control signal may, for example, be generated by a circuit (not shown) which determines the difference between the actual value and the desired value of the parameter under control. Amplifier 18 acts as a comparator to generate a positive-going output signal whenever the amplitude of the ramp waveform exceeds the d.c. control signal. The comparator output signal is shown in FIG. 2*d.*

Comparator 18 is also coupled to a monostable multivibrator circuit 20 which generates a positive-going pulse (shown in FIG. 2*e*) when the amplitude of the ramp signal first exceeds the d.c. control signal. The pulse generated by monostable circuit 20 is applied to the clock (C) input of J-K flip-flop 30. The flip-flop will go either set or reset during the occurrence of the clock pulse depending upon the polarity of the signal at its J-K inputs, respectively. The polarity of the signal at the J input is determined by the combination of NOR gate 22 and NOR gate 24. The polarity of the signal at the K input is determined by the combination of NOR gate 26 and NOR gate 28.

Two input NOR gate 22 has one input connected to the Q output of flip-flop 16 and the other input connected to the output of comparator 18. The output of NOR gate 22 is connected to one input of two input NOR gate 24. The other input of gate 24 is connected to the Q output of flip-flop 30. Two input NOR gate 26 has one input connected to the $\overline{Q}$ output of flip-flop 16 and has the other input connected to the output of comparator 18. The output of NOR gate 26 is connected to one input of two input NOR gate 28. The other input of gate 28 is connected to the $\overline{Q}$ output of flip-flop 30.

The generation by flip-flop 30 at its Q output of a phased shift version (shown in FIG. 2*f*) of the MAIN output signal appearing at the Q output of flip-flop 16 will now be described. For purposes of description it is assumed that just prior to the time designated as $t_0$ in FIG. 2 both flip-flops are reset. At time $t_0$ the output signal of oscillator 12 undergoes a positive transition and flip-flop 16 is clocked set. The Q output of the flip-flop (FIG. 2*b*) goes high and the output of NOR gate 22 goes low thereby placing a low on the input of gate 24 connected thereto. As long as flip-flop 16 remains set, the output of gate 22 is low. The other input to gate 24 is also low as flip-flop 30 is reset. A high signal is therefore placed on the J input of flip-flop 30. Gate 28, on the other hand, having one input connected to the $\overline{Q}$ output of the flip-flop places a low on the flip-flop's K input. Flip-flop 30 is therefore primed to go set upon the occurrence of a clock pulse at its C input.

Figure 2:
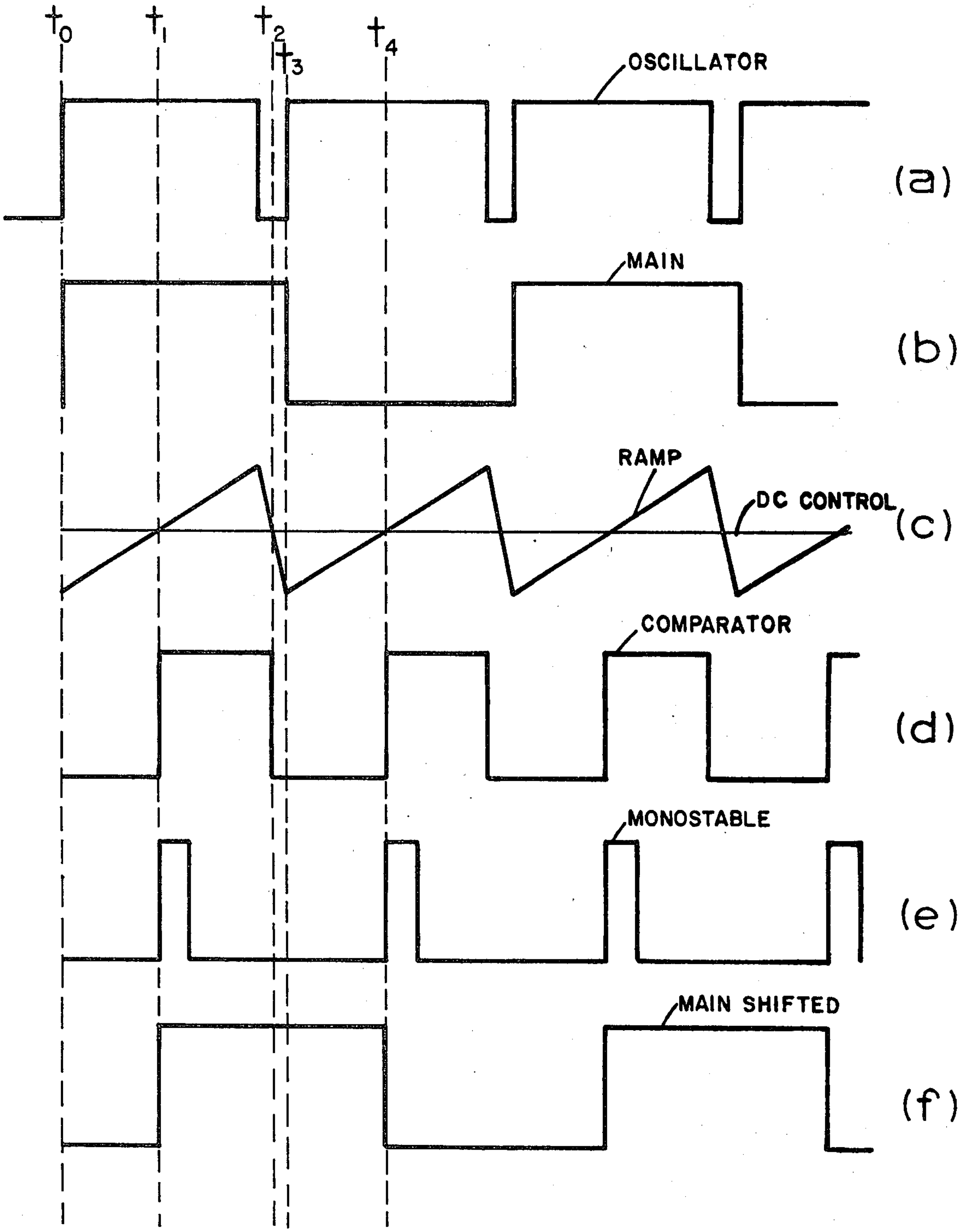
FIG. 2 are the waveforms associated with the present invention when the phase relationship between the two periodic output signals is controlled to fall between zero and 180 degrees.

At the time designated in FIG. 2 as $t_1$ the amplitude of the ramp signal exceeds the d.c. control signal (FIG. 2*c*) and the output of comparator 18 goes high (FIG. 2*d*). This change in polarity of the comparator output has no effect on the signals at the J and K inputs of flip-flop 30. The change in comparator output polarity does, however, cause monostable circuit 20 to generate a clock pulse (FIG. 2*e*) to flip-flop 30. In response thereto the flip-flop sets. Thus, at time $t_1$ the Q output of the flip-flop (FIG. 2*f*) changes from a low to a high level.

The setting of the flip-flop causes the polarity of the signals at its J and K inputs to change at time $t_1$. The change in polarity of the J input results from the change in polarity at the input of gate 24 connected to the flip-flop's Q output. The signal at the J input therefore changes from a high level to a low level at time $t_1$. The change in polarity at the input arises in the following manner. At time $t_1$ the $\overline{Q}$ output of flip-flop 16 is low, but the output of comparator 18 changes from a low to a high thereby placing a low at the input of gate 28 connected to the output of gate 26. At the same time flip-flop 30 sets and its $\overline{Q}$ output goes low thereby placing a low at the input of gate 28 connected thereto. The output of gate 28 therefore goes high at time $t_1$, and the signal at the flip-flop's K input therefore changes from a low level to a high level at this time.

At the time designated as $t_2$ in FIG. 2 the output of the comparator 18 changes in polarity from a high level to a low level. This change in polarity arises as follows. At the end of each cycle of the periodic signal generated by oscillator 12, the oscillator generates a negative-going pulse of narrow width. The leading edge of this pulse causes the output signal of the ramp generator 14 to fall in amplitude. When the ramp generator is embodied by the capacitor-transistor combination described previously this leading edge turns on the transistor to thereby provide a low resistance path for capacitor discharge. As the capacitor discharges the amplitude of the ramp falls below the d.c. control signal at time $t_2$. At that time the output of the comparator changes in polarity from positive to negative. With flip-flop 16 still set, the change in comparator output polarity at time $t_2$ causes the polarity of the signal at the K input to flip-flop 30 to change from a high to a low.

The trailing edge of the negative-going pulse generated by oscillator 12 occurs at the time designated as $t_3$ in FIG. 2. At that time the following events occur simultaneously. Flip-flop 16 is clocked reset by the trailing edge and its Q and Q outputs change in polarity. A high level signal is therefore placed on the input to gate 26 connected to the $\overline{Q}$ output. As flip-flop 30 is still set, the change in polarity of the $\overline{Q}$ output causes the polarity at the K input to change from a low to a high. Flip-flop 30 is once again primed to go reset upon the occurrence of the next clock pulse from monostable 20. The change in polarity of the Q output of flip-flop 16 has no effect on the polarity of the signal at the J input to flip-flop 30 as that flip-flop is still set. The occurrence of the trailing edge of the pulse generated by oscillator 12 also allows the ramp generator output signal to increase linearly. Where the ramp generator is embodied by the capacitor-transistor combination described previously, the occurrence of the trailing edge turns off the transistor and allows the capacitor to be charged by the constant current. Thus, at time $t_3$, flip-flop 16 is reset and flip-flop 30 is primed to go reset upon the occurrence of the next clock signal from monostable 20.

At the time designated as $t_4$ in FIG. 2 the ramp waveform once again exceeds the d.c. control signal and a pulse for clocking flip-flop 30 is generated by monostable circuit 20. Upon the occurrence of that pulse, flip-flop 30 is clocked reset. The output of comparator 18 is now high and gates 22 and 24 place a high signal on the J input of the flip-flop. As the flip-flop is now reset, gate 28 places a low on the K input independent of the output polarity of either comparator 18 or the $\overline{Q}$ output of flip-flop 16. Flip-flop 30 is now primed to go set the next time the ramp signal's amplitude exceeds the amplitude of the d.c. control signal.

Flip-flop 30 therefore changes state to follow the changes of state of flip-flop 16. The signals appearing on the Q outputs of the flip-flops are identical square waves having a phase relationship therebetween which is controlled by the relative amplitudes of the input signals to comparator 18. Thus, circuit 10 generates two square waves having a controlled phase relationship.

The amount of the phase shift between the Q output of flip-flop 30 and the Q output of flip-flop 16 is a function of the relative amplitude of the d.c. control signal as compared to the ramp waveform. From FIG. **2*e* it is seen that the shifted output occurs upon the occurrence of a pulse from monostable circuit 20. Circuit 20 generates a pulse when the ramp signal exceeds the d.c. control level. Increasing the d.c. control signal amplitude causes monostable circuit 20 to generate a pulse later in time to thereby increase the phase shift between the shifted output and the main output. Decreasing the d.c. control signal amplitude causes monostable circuit 20** to generate a pulse earlier in time to thereby decrease the phase shift between the shifted output signal and the main output signal. Changing the amplitude of the d.c. control signal thereby allows the phase between the shifted output and the main output to vary between zero degrees and 180 degrees.

As described above, circuit 10 is used in the feedback loop of a system to control a system output parameter. It is the phase relationship between the Q and/or $\overline{Q}$ outputs of flip-flops 16 and 30 which is used to control the system output parameter. There are, however, two conditions of the system output parameter which require that the phase relationship between the flip-flops' Q and/or $\overline{Q}$ outputs be maintained fixed either at 180 or zero degrees. One such conditon occurs when the amplitude of the d.c. control signal is sufficiently positive so that no portion of the ramp signal is intercepted. Such a condition may, for example, occur where the system output parameter under control is either at or very close to zero in amplitude. For example, if circuit 10 is used in a power supply to control the conduction of semi-conductor elements to thereby regulate the supply's output voltage, such a condition may occur when the supply's output power is zero. Under that condition it would be desirable for the square waves generated by flip-flops 16 and 30 to have a 180 degree phase relationship therebetween. The other such condition occurs where the amplitude of the error signal is so low that again no portion of the ramp signal is intercepted. Under that condition it would be desirable for the square waves generated by flip-flops 16 and 30 to have a zero degree phase relationship maintained therebetween.

Circuit 10 therefore includes phase detector 32 and phase limit control 34 which are used in combination to generate the clocking pulses to maintain the zero and 180 degree phase relationship between the square waves for each of the two conditions described above. The operation of these circuits will first be described in general and then with respect to the circuit schematics shown in FIG. 3 and the waveforms shown in FIGS. 4 and 5 for the zero and 180 degree phase relationships, respectively.

Phase detector 32 has two inputs, one of which is connected to the Q output of flip-flop 16 and the other of which is connected to the Q output of flip-flop 30. The signal on the phase detector's output is low only when either the MAIN or shifted output signals each alone (but not simultaneously) are high. Phase detector 32 therefore exclusively OR's the Q outputs of flip-flops 16 and 30. The output of the phase detector is connected as one input to phase limit control circuit 34. Circuit 34 also has inputs connected to receive the output signals of oscillator 12 and comparator 18 and the signals appearing on the Q and $\overline{Q}$ outputs of flip-flop 16. The two outputs of circuit 34 are connected to the S (set) and R (reset) inputs of flip-flop 30.

Phase detector 32 and circuit 34 function in combination to provide appropriately timed pulses to the S and R inputs of flip-flop 30 to thereby maintain either the zero or 180 degree phase relationship between the MAIN and the shifted signals. When the control signal is lower in amplitude than the ramp signal, circuit 34 functions to provide a pulse to the S input of flip-flop 30 which occurs in time upon the setting of flip-flop 16 and a pulse to the R input of flip-flop 30 which occurs in time upon the resetting of flip-flop 16. The Q outputs of the two flip-flops are therefore maintained in phase for that condition. When the control signal is higher in amplitude than the ramp signal amplitude, circuit 34 functions to provide a pulse to the R input of flip-flop 30 which occurs in time upon the setting of flip-flop 16 and a pulse to the S input of flip-flop 30 which occurs in time upon the resetting of flip-flop 16. The Q outputs of the two flip-flops are therefore maintained 180 degrees out of phase for that condition.

Figure 3:
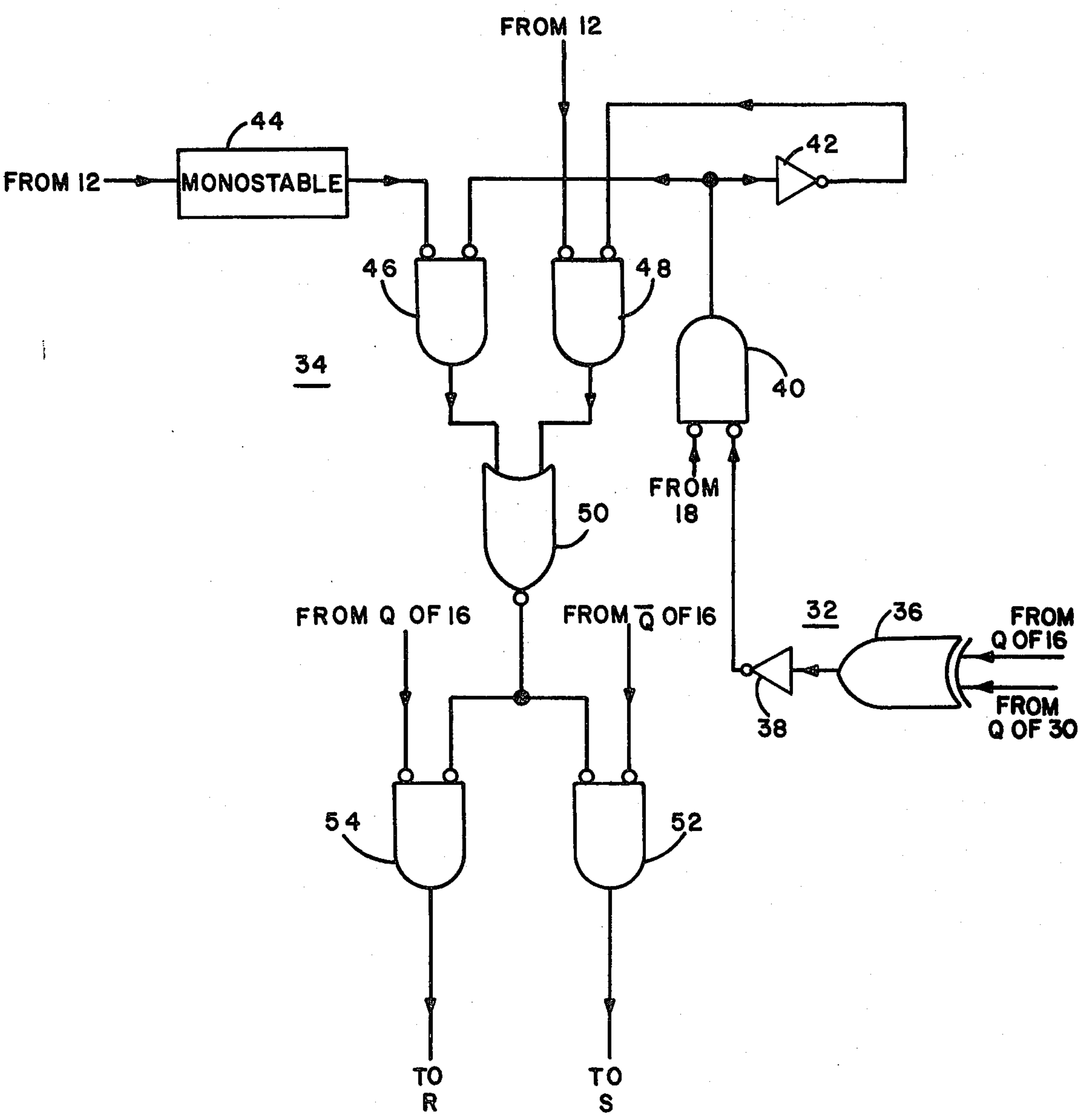
FIG. 3 is a schematic diagram of the phase detector and the zero and 180 degree control circuits shown in FIG. 1.

Referring now to FIG. 3 there is shown a detailed circuit schematic for phase detector 32 and phase limit control 34 of FIG. 1. Phase detector 32 comprises the combination of two input exclusive OR gate 36 and inverter 38. One input of gate 36 is connected to receive the signal on the Q output of flip-flop 16 while the other input to the gate is connected to receive the signal on the Q output of flip-flop 30. When either, but not both, of the input signals to gate 36 are high, the output of the phase detector is low. When both input signals to the gate are either high or low simultaneously, the output of the phase detector is high. The phase detector output is connected as one input to phase limit control 34.

Control circuit 34 must provide pulses to the S and R inputs of flip-flop 30 which occur at appropriate times to maintain the phase relationship between the Q and/or $\overline{Q}$ outputs of flip-flops 16 and 30 at either zero or 180 degrees. When, however, the amplitude of the d.c. control signal is such as to intercept the ramp signal, circuit 34 may be designed to provide no pulses to the S and R inputs of flip-flop 30. On the other hand, circuit 34 may be designed to provide pulses to the S and R inputs which, however, occur in time with the setting and resetting of the flip-flop by the signal of its clock input. These pulses to the S and R inputs, therefore, have no effect on flip-flop 30. As will be described in more detail hereinafter, the embodiment of circuit 34 shown in FIG. 3 functions to provide pulses to the S and R inputs even when the d.c. control signal intercepts the ramp signal. Thus, circuit 34 functions to generate pulses to the S and R inputs of flip-flop 30 which provide only the zero or 180 degree phase relationship and have no effect during any other phase relationship.

The output of phase detector 32 is connected as one input to two input NOR gate 40. The other input to gate 40 is connected to receive the output signal of comparator 18. The output of gate 40 is connected directly to one input of two input NOR gate 46 and by inverter 42 to one input of two input NOR gate 48. For the zero degree phase relationship, the output of comparator 18 is always high and therefore the output of gate 40 is always low independent of the phase detector output polarity. Gate 46 is therefore always enabled and gate 48 is therefore always disabled by the operation of inverter 42. For the 180 degree phase relationship, the output of comparator 18 is always low and the output of gate 40 therefore depends on the polarity of the output of the phase detector. For this phase relationship the output of the phase detector is also always low and therefore the output of gate 40 is always high. Gate 46 is therefore always disabled and gate 48 is therefore always enabled by the operation of inverter 42. Thus, for the zero degree phase relationship the output of gate 40 enables gate 46 and disables gate 48, whereas for the 180 degree phase relationship the output of gate 40 disables gate 46 and enables gate 48.

For phase relationships intermediate zero and 180 degrees, the enabled-disabled state of gates 46 and 48 are dependent on the status of flip-flops 16 and 30 and the polarity of the comparator's output signal. Assume as an example that flip-flop 16 is set; flip-flop 30 is reset and the output of comparator 18 is low (the ramp amplitude is less than the control signal amplitude). The output of phase detector 32 is low and therefore as both inputs to gate 40 are low, gate 46 is disabled and gate 48 is enabled. When the ramp signal intercepts the control signal, the output of the comparator changes in polarity and flip-flop 30 is set. Therefore, the output of gate 40 changes in polarity from a high to a low level thereby enabling gate 46 and disabling gate 48. Upon the next positive-going transition from oscillator 12, flip-flop 16 resets; the next period of the ramp signal starts and the output of the comparator once again goes low. Gate 46 is once again disabled and gate 48 is once again enabled. Thus, for a phase relationship intermediate zero and 180 degrees, gates 46 and 48 are alternately enabled and disabled depending on the relative amplitudes of the control and ramp signals.

The other input to gate 46 is connected to receive the output signal of a monostable multivibrator circuit 44. Monostable 44 has its input connected to the output of oscillator 12 and each time the oscillator signal undergoes a positive-going transition, circuit 44 generates a positive pulse of narrow width. The pulses generated by circuit 44 are shown in FIGS. 4*b* and 5*b*. For convenience, the oscillator output signal is shown in FIGS. 4*a* and 5*a*. The other input to gate 48 is connected to receive the signal generated by oscillator 12. As will be described in more detail hereinafter, it is these connections which allow gates 46 and 48 to provide the pulses to the S and R inputs of flip-flop 30 to maintain the zero and 180 degree phase relationships, respectively.

The providing of the set and reset pulses by gate 46 for the zero degree phase relationship will now be described in connection with FIG. 4. Assume just prior to the time designated as $t_0$ in FIG. 4 both flip-flops 16 and 30 are reset. The output of monostable 44 is low, and therefore as gate 46 is enabled a high appears at its output. Two input NOR gate 50 has one input connected to receive the output of gate 46 and the other input connected to receive the output of gate 48. As gate 48 is disabled its output is and remains low. The output of gate 50 which is low at the time is connected to one input of two input NOR gate 52 and to one input of two input NOR gate 54. The other input of gate 52 is connected to the $\overline{Q}$ output of flip-flop 16 whereas the other input of gate 54 is connected to the flip-flop's Q output. As the flip-flop is reset at this time, gate 52 provides a low level to the S input of flip-flop 30 whereas gate 54 provides a high to the R input of that flip-flop. The output signals from gates 52 and 54 are shown in FIGS. 4*c* and 4*d*, respectively.

At time $t_0$ the oscillator output signal goes negative. This change in polarity has no effect on the outputs of the gates described above. At the end of its negative pulse, designated as time $t_1$ in FIG. 4, the oscillator signal undergoes a positive transition to thereby clock flip-flop 16 set. The setting of the flip-flop has no effect on the enabling of gate 46 and the disabling of gate 48 as the output of comparator 18 is always high for the zero phase relationship. Monostable circuit 44 does, however, generate a narrow width positive pulse which begins at time $t_1$. The leading edge of this pulse causes the output of gate 46 to go low thereby causing the output of gate 50 to go high. The output of gate 52 remains low. The output of gate 54 does change at time $t_1$ from a high to a low and thereby places a negative-going transition on the R input of flip-flop 30. This transition has no effect on the flip-flop's state as the R as well as the S inputs respond only to positive signals.

Figure 4:
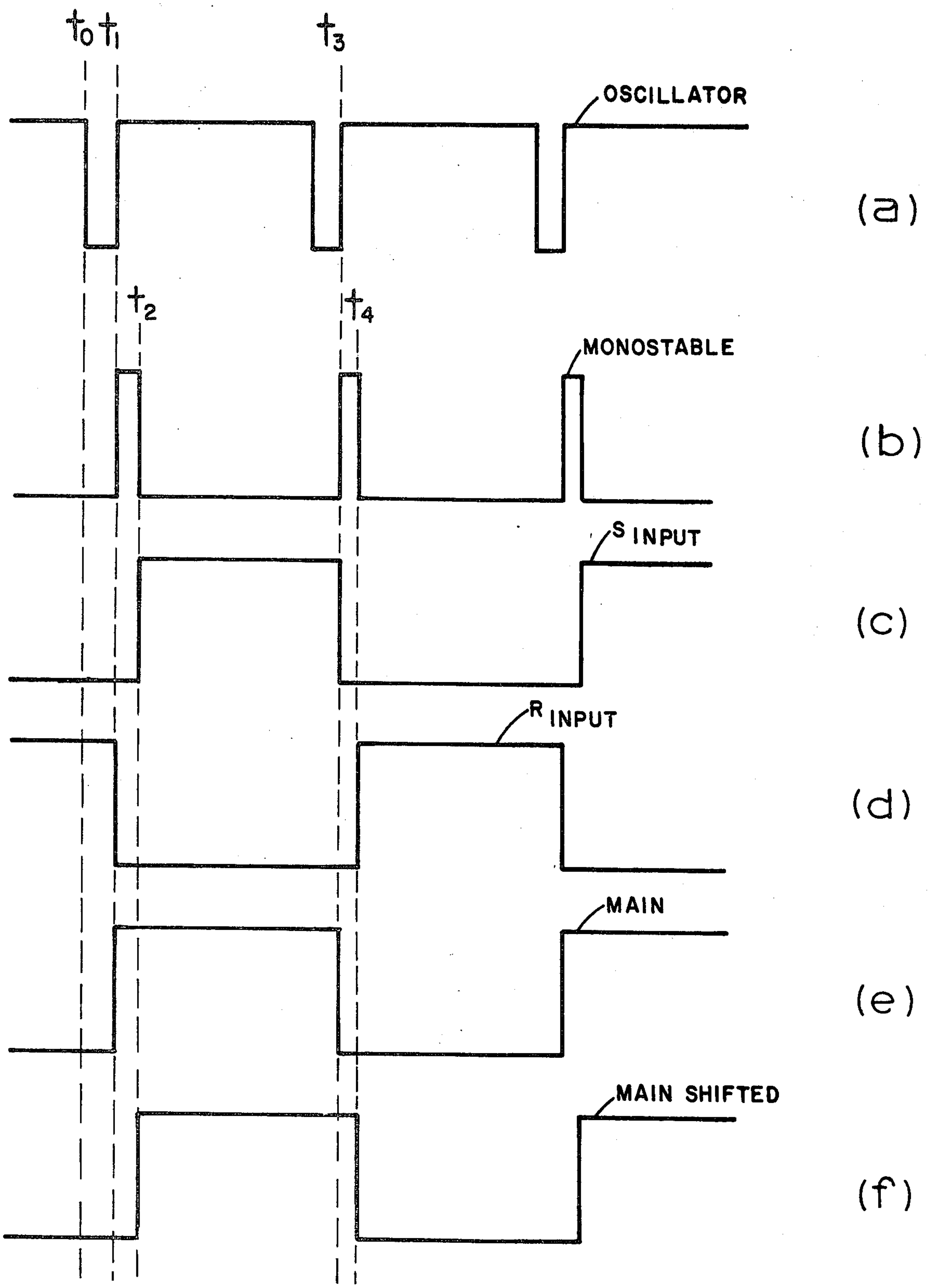
FIG. 4 are the waveforms associated with the present invention when the phase relationship between the two periodic output signals is controlled to be at substantially zero degrees.

At the time designated as $t_2$ in FIG. 4 the trailing edge of the positive pulse generated by monostable circuit 44 occurs. The input of gate 46 connected thereto once again goes low causing the outputs of gates 46 and 50 to go high and low, respectively. With flip-flop 16 now set, its $\overline{Q}$ output is low and therefore both inputs to gate 52 are now low. The output of gate 52 therefore undergoes a low to high transition at time $t_2$. It is this transition which appears at the S input to flip-flop 30 thereby setting the flip-flop. Thus, flip-flop 30 set substantially simultaneously with the setting of flip-flop 16 to thereby maintain a zero degree phase relationship between the MAIN ($\overline{\text{MAIN}}$) and MAIN ($\overline{\text{MAIN}}$) shifted output signals of circuit 10.

Upon the occurrence of the next positive-going transition of oscillator 12 at the time designated as $t_3$ in FIG. 4, sequence similar to that described above is initiated. The principal differences between the two sequences are that flip-flop 16 resets, the output of gate 52 goes low and at the trailing edge of the pulse generated by monostable 44 (time $t_4$) it is gate 54 which undergoes the positive transition to thereby reset flip-flop 30. Thus, flip-flop 30 resets substantially simultaneously with the resetting of flip-flop 16 to thereby maintain a zero degree phase relationship between the MAIN ($\overline{\text{MAIN}}$) and MAIN ($\overline{\text{MAIN}}$) shifted output signals of circuit 10. These outputs are shown in FIG. 4*e* and FIG. 4*f*, respectively.

The providing of the set and reset pulses by gate 48 for the 180 degree phase relationship will now be described in connection with the waveforms shown in FIG. 5. Assume just prior to the time designated as $t_0$ in that figure flip-flop 16 is reset and flip-flop 30 is set. Gate 48 is enabled but as the output of oscillator 12 is high, a low appears at the output of the gate. As gate 46 is disabled its output is and remains low, the output of gate 50 high. With flip-flop 16 reset, the outputs of gates 52 and 54 both provide lows to the S and R inputs of flip-flop 30. The output signals from gates 52 and 54 are shown in FIGS. 5*c* and 5*d*, respectively.

At time $t_0$ the oscillator output signal goes negative. This change in polarity has no effect on the outputs of gates 40, 46 and 52 but does cause the outputs of gates 48, 50 and 54 to change in polarity. There is no effect on gate 52 as flip-flop 16 is still reset at this time. The output of gate 54 changes in polarity from a low to a high level thereby providing a positive-going transition to the R input of flip-flop 30. Therefore, flip-flop 30 resets at this time. At the time designated as $t_1$ in FIG. 5 the oscillator output undergoes a positive transition which clocks flip-flop 16 set. The positive transition of the oscillator output has no effect on the outputs of gates 40, 46 and 52, but does cause the outputs of gates 48, 50 and 54 to once again undergo a change in polarity. The output of gate 54 goes low at this time. Thus, flip-flop 30 resets just prior to the setting of flip-flop 16 to thereby maintain a substantially 180 degree phase relationship between the MAIN ($\overline{MAIN}$) and MAIN ($\overline{MAIN}$) shifted output signals of circuit 10.

Figure 5:
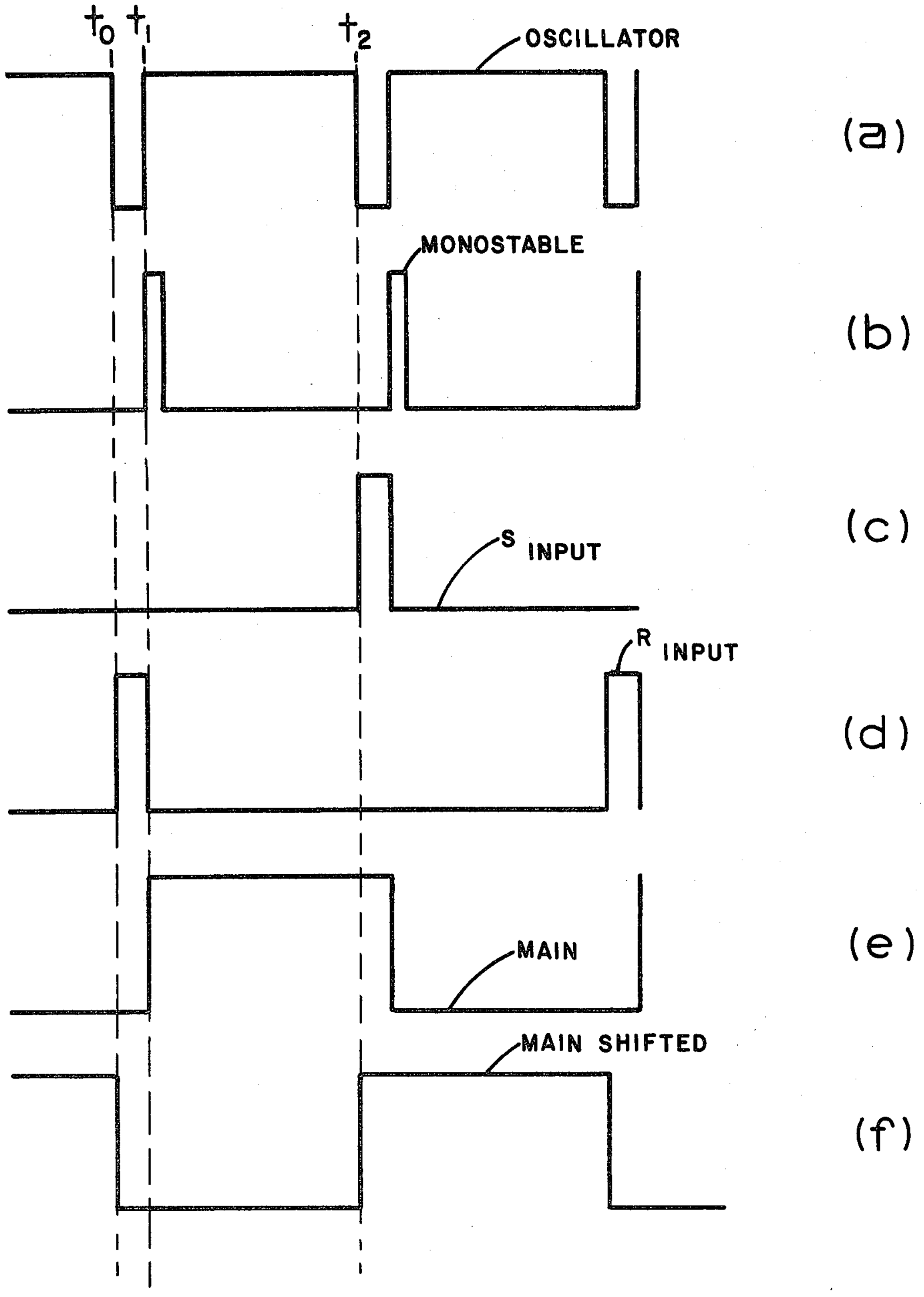
FIG. 5 are the waveforms associated with the present invention when the phase relationship between the two periodic output signals is controlled to be at substantially 180 degrees.

Upon the occurrence of the next negative-going transition of oscillator 12 at the time designated as $t_2$ in FIG. 5, sequence similar to that described above is initiated. The principal differences between the two sequences are that gate 52 undergoes a positive transition to thereby set flip-flop 30 and at the positive transition of the oscillator output signal flip-flop 16 resets and the output of gate 52 goes low. Thus, flip-flop 30 sets just prior to the resetting of flip-flop 16 to thereby maintain a substantially 180 degree phase relationship between the MAIN ($\overline{MAIN}$) and MAIN ($\overline{MAIN}$) shifted output signals of circuit 10. These outputs are shown in FIGS. 5*e* and 5*f*, respectively.

When the d.c. control signal intercepts the ramp signal circuit 34 provides pulses to the S and R inputs of flip-flop 30 which have no effect on the status of the flip-flop. The operation of circuit 34 for this condition will now be described. Assume flip-flop 16 is set; flip-flop 30 is reset and the amplitude of the ramp is below the level of the d.c. control signal. The outputs of both comparator 18 and inverter 38 are low at this time. Therefore, the output of gate 40 is high and gate 46 is disabled. Gate 48 is also disabled as the oscillator output is high at this time. The output of gate 50 is therefore high and gates 52 and 54 provide lows to the S and R inputs of the flip-flop.

At the time $t_1$ shown in FIG. 2 the amplitude of the ramp signal exceeds the d.c. control signal and the output of comparator 18 goes high. Simultaneously therewith flip-flop 30 sets, as a clock pulse is generated by monostable 20 of FIG. 1. When the output of the comparator goes high the output of gate 40 changes in polarity from a high to a low. Gate 46 is now enabled and a monostable 44 produces positive pulses only upon the positive-going transition of oscillator 12, the output of the monostable is low. The output of gate 46 changes in polarity from a low to a high causing the output of gate 50 to go low. With flip-flop 16 set the output of gate 52 changes in polarity from a low to a high. Therefore, when the ramp signal amplitude exceeds the d.c. control signal amplitude, the S input of flip-flop 30 sees a positive-going transition. This transition has no effect on the state of the flip-flop as the flip-flop has already set by the clock pulse generated by monostable 20.

Upon the occurrence of the next positive-going transition from oscillator 12, flip-flop 16 resets. The output of comparator 18 is once again low. Gates 52 and 54 are once again disabled and the S and R inputs of flip-flop 30 are once again low. When the ramp signal next exceeds the d.c. control signal, flip-flop 30 is clocked reset. Circuit 34 simultaneously provides through gate 54 a positive-going transition on the flip-flop's R input. This transition has no effect on the flip-flop as the flip-flop has already reset by the clock pulse generated by monostable 20. Thus, when the amplitude of the control signal is such as to intercept the ramp signal, circuit 34 provides pulses to the S and R inputs of flip-flop 30 but these pulses have no effect on the status of the flip-flop.

It is to be understood that the description of this preferred embodiment is intended to be only illustrative, rather than exhaustive, of the present invention. Those of ordinary skill will be able to make certain additions, deletions and/or modifications to embodiments of the disclosed subject matter without departing from the spirit of the invention or its scope, as defined by the appended claims.

What is claimed is:

1. A circuit for generating as a funtion of the amplitude of a d.c. control signal at least two periodic output signals having a phase relationship controllable between zero and 180 degrees, said circuit comprising:

(a) oscillator means for generating a periodically recurring signal of predetermined frequency and waveform said signal having during each period a first portion of first predetermined amplitude and a second portion of second predetermined amplitude said signal not being either of said at least two periodic output signals;

(b) means responsive to said oscillator signal for generating a periodically recurring signal having a ramp waveform said ramp starting each time said first portion of said oscillator signal begins;

(c) means for comparing said ramp signal to said d.c. control signal said comparison means generating a signal having a first amplitude when said d.c. control signal exceeds said ramp signal and a second amplitude when said ramp signal exceeds said control signal;

(d) first output means responsive to the beginning of said first portion of said oscillator signal for generating simultaneously one of said periodic output signals and another identical signal having a 180 degree phase relationship thereto; and (e) second output means responsive to said signal generated by said comparator means and said signals generated by said first means for generating when said comparator means signal changes from said first amplitude to said second amplitude at least the other of said periodic output signals whereby the phase relationship between said one and said other periodic output signals is controlled as a function of said d.c. control signal to be between zero and 180 degrees.

2. The circuit of claim 1 further including phase limit control means responsive to at least said one and said other periodic output signals and said identical signal for generating first and second signals, said second output means responsive to said first and second signals for generating said other output signal at a phase of substantially zero degrees with respect to said one signal when said control signal is always less than said ramp signal and for generating said other output signal at a phase of substantially 180 degrees with respect to said one signal when said control signal is always greater than said ramp signal.

3. The circuit of claim 2 wherein said one and said other signals both have a first amplitude and a second amplitude and wherein said phase limit control means includes phase detector means responsive to said signals for generating a signal having a predetermined amplitude when both of said signals are simultaneously at said first amplitude and an amplitude opposite to said predetermined amplitude when said signals are not simultaneously at said first amplitude.

4. The circuit of claim 3 wherein said phase limit control means further includes limit means responsive to said phase detector means signal and at least said one and said identical signals for generating said first and second signals.

5. The circuit of claim 2 wherein said second output means includes means having a set input and a reset input, said set input responsive to said first signal and said reset input responsive to said second signal.

6. The circuit of claim 1 or 2 wherein said second output means includes a flip-flop having J-K inputs and a clock input, said J input responsive to at least one of the signals generated by said first output means, said K input responsive to the other of the signals generated by said first output means, said clock input responsive to a signal representative of said change in the comparator means signal from said first amplitude to said second amplitude to thereby generate said other output signal.

7. The circuit of claim 6 wherein said second output means further includes means responsive to said comparator means signal for generating said signal representative of said change in said comparator means signal amplitude.

8. The circuit of claim 4 wherein said second output means includes means having a set input and a reset input, said set input responsive to said first signal and said reset input responsive to said second signal.

9. The circuit of claim 8 wherein said second output means includes a flip-flop having J-K inputs and a clock input, said J input responsive to at least one of the signals generated by said first output means, said K input responsive to the other of the signals generated by said first output means, said clock input responsive to a signal representative of said change in the comparator means signal from said first amplitude to said second amplitude to thereby generate said other output signal.

10. The circuit of claim 4 wherein said limit means includes first and second logic means responsive to said oscillator means signal and said phase detector means signal, said first logic means controlling the generation of said first and second signals when said phase is substantially zero degrees and said second logic means controlling the generation of said first and second signals when said phase is substantially 180 degrees.

* * * * *